United States Patent
Lee et al.

(10) Patent No.: US 8,729,615 B2
(45) Date of Patent: May 20, 2014

(54) NON-VOLATILE MEMORY DEVICE WITH HIGH SPEED OPERATION AND LOWER POWER CONSUMPTION

(75) Inventors: Chang Hyun Lee, Suwon-si (KR); Young-Woo Park, Seoul (KR); Kye-Hyun Kyung, Yeonggi-si (KR); Cheon-An Lee, Hwaseong-si (KR); Sung-il Chang, Hwaseong-si (KR); Chul Bum Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 109 days.

(21) Appl. No.: 13/248,333

(22) Filed: Sep. 29, 2011

(65) Prior Publication Data

US 2012/0146118 A1 Jun. 14, 2012

(30) Foreign Application Priority Data

Dec. 9, 2010 (KR) ........................ 10-2010-0125741

(51) Int. Cl.
*H01L 27/108* (2006.01)

(52) U.S. Cl.
USPC .... 257/296; 257/316; 257/324; 257/E27.062; 257/E27.084

(58) Field of Classification Search
USPC .................. 257/E29.324, 296, 310, 314–326, 257/E27.078, E29.3, E29.309, E27.062, 257/E27.084; 438/257, 258, 275
See application file for complete search history.

(56) References Cited

U.S. PATENT DOCUMENTS

| 6,680,230 | B2 * | 1/2004 | Arai et al. ...................... 438/258 |
| 7,029,976 | B1   | 4/2006 | Nagarad et al. |
| 7,172,940 | B1 * | 2/2007 | Chen et al. ..................... 438/258 |
| 7,183,159 | B2 * | 2/2007 | Rao et al. ....................... 438/258 |
| 7,700,993 | B2 * | 4/2010 | Cai et al. ........................ 257/315 |
| 2006/0138568 | A1 * | 6/2006 | Taniguchi et al. ............. 257/408 |
| 2007/0070720 | A1 * | 3/2007 | Lee et al. ................. 365/189.09 |
| 2008/0084764 | A1 * | 4/2008 | Pikhay et al. ............ 365/185.29 |
| 2008/0179658 | A1   | 7/2008 | Rao et al. |
| 2009/0011559 | A1 * | 1/2009 | Mizukami et al. ............ 438/257 |
| 2009/0275181 | A1 * | 11/2009 | Kato et al. .................... 438/275 |

FOREIGN PATENT DOCUMENTS

KR  10-0583969  5/2006

* cited by examiner

*Primary Examiner* — Marc Armand
(74) *Attorney, Agent, or Firm* — Volentine & Whitt, PLLC

(57) ABSTRACT

A semiconductor memory device has a memory cell region and a peripheral region. The device includes low voltage transistors at the peripheral region having gate insulation films with different thicknesses. For example, a gate insulation film of a low voltage transistor used in an input/output circuit of the memory device may be thinner than the gate insulation film of a low voltage transistor used in a core circuit for the memory device. Since low voltage transistors used at an input/output circuit are formed to be different from low voltage transistors used at a core circuit or a high voltage pump circuit, high speed operation and low power consumption characteristics of a non-volatile memory device may be.

19 Claims, 14 Drawing Sheets

NON-VOLATILE MEMORY DEVICE WITH HIGH SPEED OPERATION AND LOWER POWER CONSUMPTION

CROSS-REFERENCE TO RELATED APPLICATIONS

This application claims the benefits, under 35 U.S.C. §119, of Korean Patent Application No. 10-2010-0125741 filed Dec. 9, 2010, the entirety of which is incorporated by reference herein.

BACKGROUND

1. Field

Exemplary embodiments relate to a non-volatile semiconductor memory device such as a NAND flash memory, and more particularly, relate to a non-volatile semiconductor memory device with high speed operation and low power consumption characteristics.

2. Description of the Related Art

In general, there is widely used a flash memory device which functions as a non-volatile semiconductor memory to store information of various electronic systems.

The flash memory device may be a type of electrically erasable programmable read only memory (EEPROM) capable of simultaneously programming or erasing a plurality of memory regions through one program operation.

A NAND flash memory device with a NAND-type cell structure may have one or more advantages for storing mass information as compared with a NOR flash memory device.

A flash memory device formed on a silicon substrate may include a memory cell region and a peripheral region. Memory cell transistors of a memory cell array are arranged at the memory cell region, and functional circuits other than the memory cell transistors are arranged at the peripheral region.

Unlike the memory cell region including the memory cell transistors, high voltage and low voltage transistors are formed at the peripheral region of the flash memory device. The low voltage transistors may be used to form functional circuits such as a page buffer, a data input/output buffer, and the like.

Gate insulation films of the low-voltage transistors may be formed to be thinner than gate insulation films of the high voltage transistors. An input/output circuit including a data input buffer and a data output buffer may necessitate a high-speed operation, and a page buffer included in a core circuit, or pump circuit elements of a high voltage pump, may necessitate a low off current characteristic.

SUMMARY

One object of embodiments of the inventive concept is directed to providing a non-volatile semiconductor memory device with high speed and low power consumption characteristics.

Another object of embodiments of the inventive concept is directed to providing a non-volatile semiconductor memory device including low voltage transistors of a peripheral region are formed differently according to their purposes.

Still another object of embodiments of the inventive concept is directed to providing a non-volatile semiconductor memory device in which gate insulation films of low voltage transistors of an input/output circuit in the peripheral region are thinner than gate insulation films of low voltage transistors of a core circuit or a high voltage pump circuit in the peripheral region.

One aspect of embodiments of the inventive concept is directed to providing a non-volatile semiconductor memory device comprising a memory cell region including at least one memory cell, and a peripheral region. The peripheral region comprises: a first low voltage transistor including a gate insulation film having a first thickness; and a second low voltage transistor including a gate insulation film having a second thickness different from the first thickness.

In some embodiments, the first low voltage transistor is used in an input/output circuit, the second low voltage transistor is used in a core circuit including a page buffer, and the first thickness is less than the second thickness.

In some embodiments, an operating voltage of the first low voltage transistor is less than an operating voltage of the second low voltage transistor.

In some embodiments, the first or second low voltage transistor is a PMOS transistor having a P+ gate or an NMOS transistor having an N+ gate.

In some embodiments, the non-volatile semiconductor memory device further comprises high voltage (third) transistors disposed at the peripheral region, wherein the high voltage transistors include gate insulation films each having a third thickness that is different from the first thickness and the second thickness; and memory cell transistors disposed at the memory cell region wherein the memory cell transistors includes gate insulation films each having a fourth thickness that is different from the third thickness.

In some embodiments, the third thickness is greater than the second thickness and the fourth thickness is at least as great as the second thickness.

In some embodiments, each of the memory cell transistors includes a floating gate and a control gate, the control gate being P+ doped.

In this embodiment, the memory cell transistors are VNAND memory cells arranged in a three-dimensional stack structure and have a control gate formed of metal, respectively.

In some embodiments, the memory cell transistors are NAND flash memory cells.

Another aspect of embodiments of the inventive concept is directed to providing a non-volatile semiconductor memory device comprising a memory cell region including at least one memory cell, and a peripheral region. The peripheral region comprises an input/output circuit including a first low voltage transistor including a gate insulation film having a first thickness; and a core circuit including a second low voltage transistor including a gate insulation film having a second thickness greater than the first thickness.

In some embodiments, a threshold voltage of the first low voltage transistor is less than that of the second low voltage transistor.

In some embodiments, an operating voltage of the input/output circuit is less than an operating voltage of the core circuit.

In some embodiments, the first or second low voltage transistor is formed of a PMOS transistor having a P+ gate or an NMOS transistor having an N+ gate.

In some embodiments, the non-volatile semiconductor memory device further comprises high voltage (third) transistors disposed at the peripheral region and having corresponding gate insulation films each having a third thickness which is greater than the second thickness.

In some embodiments, the non-volatile semiconductor memory device further comprises memory cell transistors disposed at the memory cell region and including gate insulation films each having a fourth thickness that is at least as great as the second thickness.

Still another aspect of embodiments of the inventive concept is directed to providing a non-volatile semiconductor memory device comprising a memory cell region including at least one memory cell, and a peripheral region. The peripheral region comprises a first low voltage transistor having a gate insulation film with a first thickness; and a second low voltage transistor having a gate insulation film with a second thickness greater than the first thickness, wherein the second low voltage transistor belongs to a high voltage pump circuit.

In some embodiments, the first low voltage transistor belongs to an input/output circuit.

In some embodiments, the non-volatile semiconductor memory device further comprises a high voltage (third) transistor disposed at the peripheral region and including a gate insulation film having a third thickness greater than the second thickness.

In some embodiment, the non-volatile semiconductor memory device further comprises memory cell transistors disposed at the memory cell region including corresponding gate insulation films each having a fourth thickness which is at least as great as the second thickness, the memory cell transistors being arranged to have a three-dimensional structure.

In some embodiments, the second low voltage transistor is comprises a PMOS transistor of the high voltage pump circuit and the high voltage (third) transistor is used to form a capacitor of the high voltage pump circuit.

Yet another aspect of the inventive concepts is directed to providing a device comprising: a substrate having a memory cell region and a peripheral region; a nonvolatile memory cell array disposed at the memory cell region and having a plurality of nonvolatile memory cells; an input/output circuit disposed at the peripheral region and configured to communicate data with the memory cell array, the input/output circuit including a plurality of first transistors each having a gate insulation film having a first thickness; and a page buffer for the memory cell array disposed at the peripheral region, wherein the page buffer includes a plurality of second transistors each having a gate insulation film having a second thickness that is substantially greater than the first thickness.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
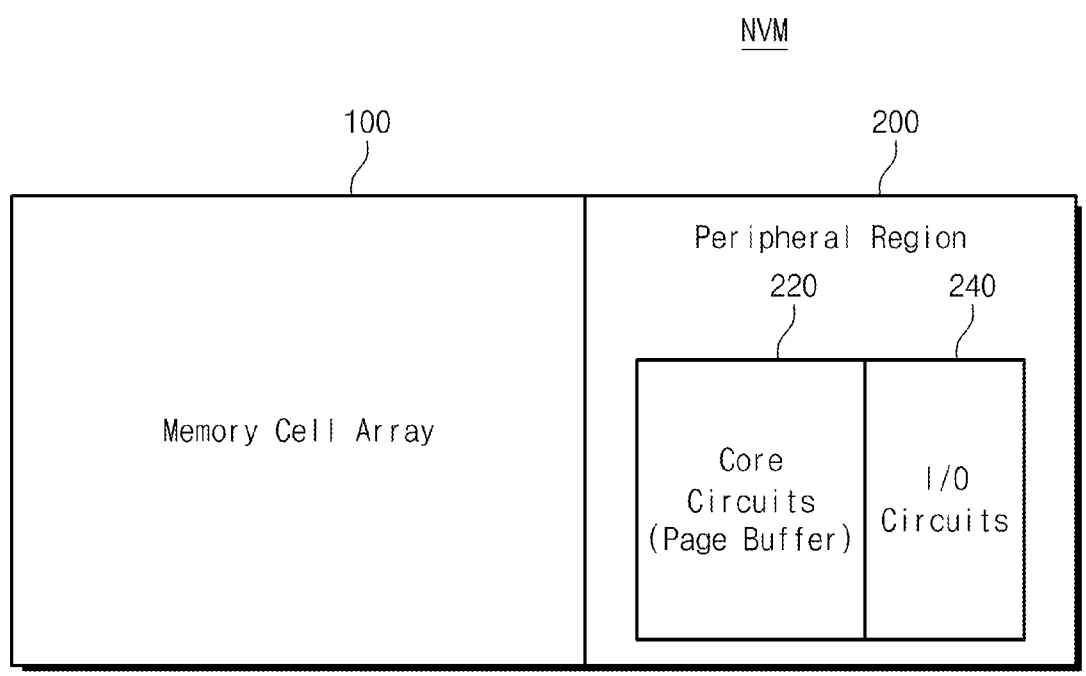
FIG. 1 is a diagram showing regions of a non-volatile semiconductor memory device according to an exemplary embodiment.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein. As used herein the term "substantially" shall be understood to mean "by at least 25%.} Thus, for example, when two thicknesses are said to be substantially different, it is understood that one of the thicknesses is at least 25% larger or smaller than the other thickness.

In figures, the same or similar reference symbols may be used to represent the same or similar constituent elements. In some figures, interconnection of elements and lines may be used to describe the inventive concept effectively. Other elements or circuit blocks may be further provided.

Embodiments disclosed therein may include their complementary embodiments. Note that detailed operations and functions of a non-volatile semiconductor memory device and general erasing, programming, and reading operations may be skipped to prevent the inventive concept from becoming ambiguous.

Figure 2:
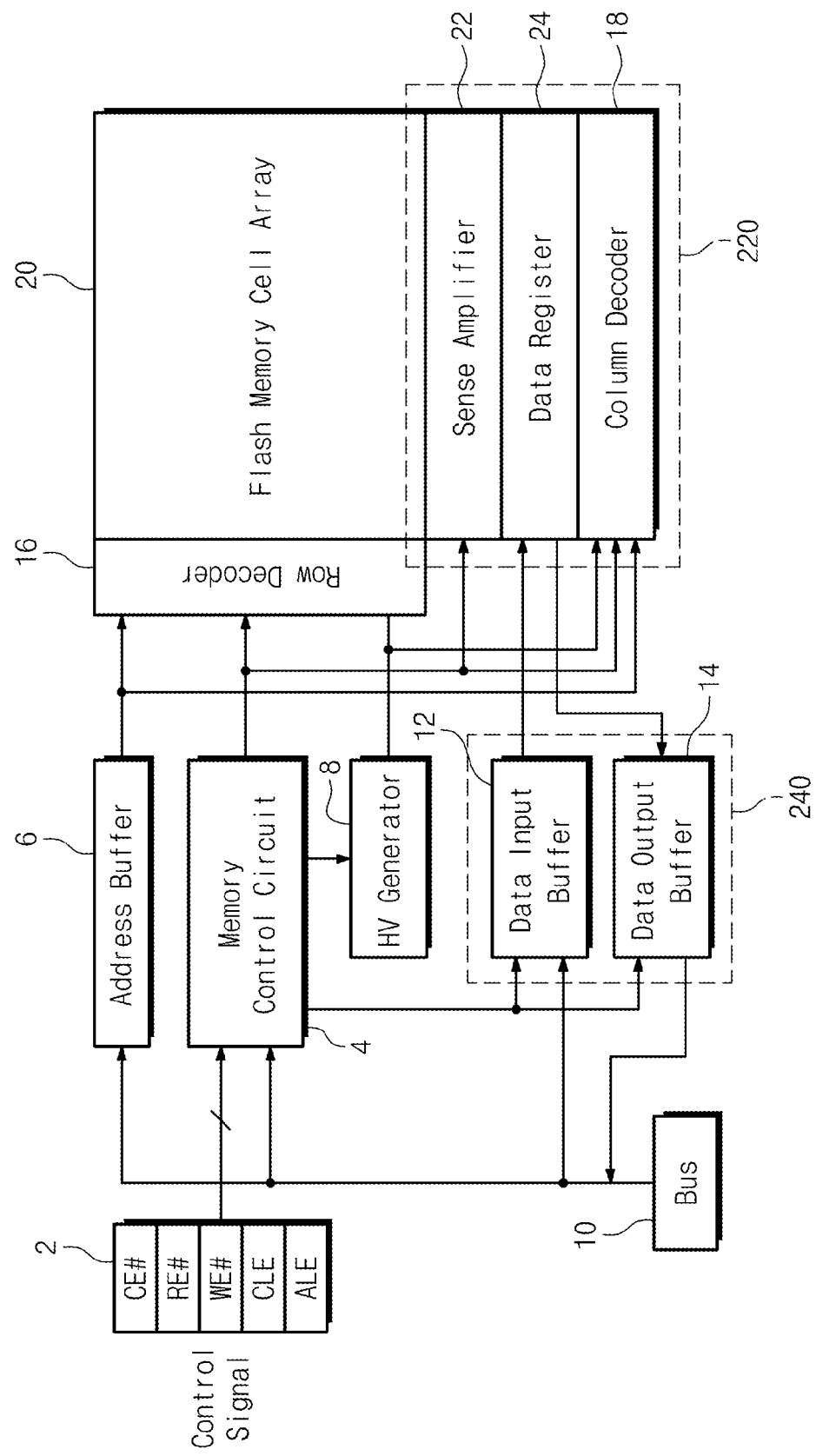
FIG. 2 is a block diagram of a flash memory device illustrated in FIG. 1.

FIG. 1 is a diagram showing regions of a non-volatile semiconductor memory device according to an exemplary embodiment, and FIG. 2 is a block diagram of a flash memory device illustrated in FIG. 1.

Referring to FIG. 1, a non-volatile semiconductor memory device may include a memory cell region 100 and a peripheral region 200. A memory cell array may be formed at memory cell region 100, and a functional circuit other than the memory cell array may be formed at peripheral region 200. A core region can be disposed between memory cell region 100 and peripheral region 200, in general. However, as illustrated in FIG. 1, peripheral region 200 may include the core region.

Peripheral region 200 may include a core circuit 220 having a page buffer, etc. and an input/output circuit 240 having a data input buffer and a data output buffer.

To obtain high speed operation and low power consumption characteristics, gate insulation films of low voltage transistors within core circuit 220 may be formed to be different from those of low voltage transistors within input/output circuit 240.

Herein, the gate insulation films of the low voltage transistors within core circuit 220 may be formed to be thinner, and in general substantially thinner (i.e., at least 25% thinner), than those of the low voltage transistors within input/output circuit 240. In some embodiments, the low voltage transistors within input/output circuit 240 may be twice the thickness, or more than twice the thickness, of the low voltage transistors within core circuit 220.

In FIG. 2, there is illustrated an exemplary embodiment of a non-volatile semiconductor memory device to which one or more aspects of the inventive concept may be applied.

The example non-volatile semiconductor memory device illustrated in FIG. 2 is a flash memory device, which may include a flash memory cell array 20, a page buffer 220, and an input/output circuit 240. The flash memory device may further include a command buffer 2, an address and data bus 10, an address buffer 6, a memory control circuit 4, a high voltage generator 8, and a row decoder 16.

Flash memory cell array 20 may be disposed at a memory cell region 100 in FIG. 1. Flash memory cell array 20 may be formed to have a memory cell array circuit structure illustrated in FIG. 6 or a three-dimensional cell structure illustrated in FIGS. 7 to 10 to increase a data storage capacity more and more.

Page buffer 220 may include a sense amplifier 22, a data register 24 and a column decoder 18 and may be disposed at a peripheral region 200 in FIG. 1. Further, input/output circuit 240 may be disposed at peripheral region 200. Input/output circuit 240 may comprise a data input buffer 12 and a data output buffer 14.

Figure 3:
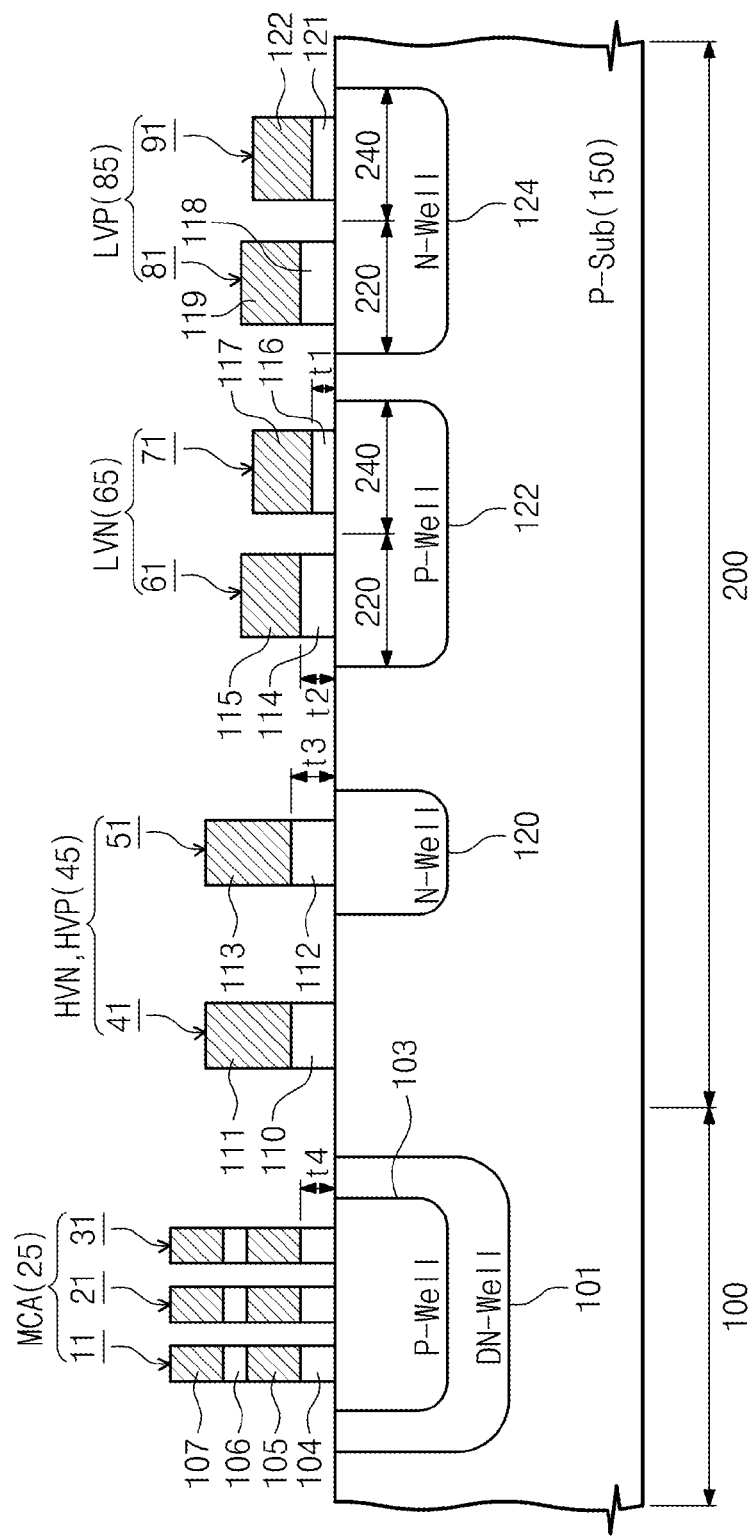
FIG. 3 is a cross-sectional view of MOS transistors forming some circuit blocks in FIG. 2.

In an exemplary embodiment as illustrated in FIG. 3 and described in greater detail below, gate insulation films of low voltage transistors within input/output circuit 240 may be formed to be thinner, and typically substantially thinner (i.e., at least 25% thinner), than those of low voltage transistors within core circuit 220. In some embodiments, the low voltage transistors within input/output circuit 240 may be twice the thickness, or more than twice the thickness, of the low voltage transistors within core circuit 220.

Input/output circuit 240 may have a high speed operation characteristic since it is driven at a relatively low operating voltage. In contrast, core circuit 220 including the page buffer may be driven at a relatively high operating voltage for improvement of immunity from program disturbance of memory cells, so that an off current is reduced. As a result, threshold voltages of the low voltage transistors within core circuit 220 may be higher in level than those of the low voltage transistors within input/output circuit 240.

Figure 5:
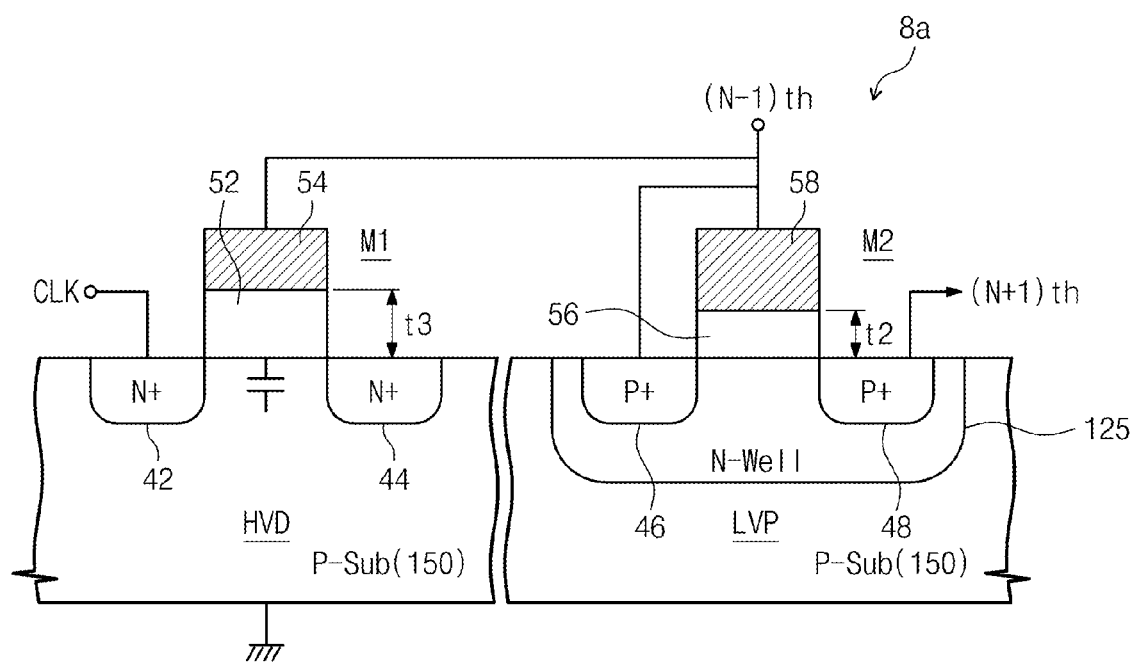
FIG. 5 is a cross-sectional view of MOS transistors forming a pump unit 8*a* in FIG. 4.

Meanwhile, in another exemplary embodiment as illustrated in FIG. 5 and described in greater detail below, gate insulation films of low voltage transistors within input/output circuit 240 may be formed to be thinner than those of low voltage transistors within high voltage generator 8.

FIG. 3 is a cross-sectional view of MOS transistors forming some circuit blocks in FIG. 2.

Referring to FIG. 3, a memory cell array (MCA) 25 may be formed at memorcell region 100 of a p-type substrate 150. High voltage (i.e., third) transistors 45 (i.e., transistors 41 and 51) and low voltage transistors 65 (i.e., transistors 61 and 11) and low voltage transistors 85 (i.e., transistors 81 and 91) may be formed at a peripheral region 200.

Among low voltage NMOS transistors (NVN) 65 formed at a p-well 122, a first low voltage transistor 71 may be placed at peripheral region 200 and have a gate insulation film 116 having a first thickness t1 as part of input/output circuit 240. Meanwhile, among the low voltage NMOS transistors 65, a second low voltage transistor 61 may be placed at peripheral region 200 and have a gate insulation film 114 having a second thickness t2 as part of core circuit 220, where t2 is greater than t1, and typically substantially greater (i.e., at least 25% greater) than t1. In some embodiments, the thickness t2 may be twice the thickness, or more than twice the thickness, of the thickness t1. Herein, first and second low voltage transistors 71 and 61 may have heavily doped N+ gates 117 and 115, respectively.

Among low voltage PMOS transistors 85 formed at an n-well 124, a first low voltage transistor 91 may be placed at peripheral region 200 and have a gate insulation film 121 having the first thickness t1 as part of input/output circuit 240. Meanwhile, among low voltage PMOS transistors 85, second low voltage transistor 81 may be placed at peripheral region 200 and have a gate insulation film 118 having the second thickness t2 that is greater, and typically substantially greater (i.e., at least 25% greater), than the first thickness t1 as part of core circuit 220. Herein, first and second low voltage transistors 91 and 81 may have heavily doped P+ gates 122 and 119, respectively. It is possible effectively to reduce an off current at a low threshold voltage by using P+ gates.

Threshold voltages of first low voltage transistors 71 and 91 may be lower in level than those of second low voltage transistors 61 and 81. Therefore, first low voltage transistors 71 and 91 may operate at a relatively low operating voltage, and second low voltage transistors 61 and 81 may operate at a relatively high operating voltage.

In FIG. 3, a high voltage NMOS (HVN) transistor 41 may be formed on p-type substrate 150, and a high voltage PMOS (HVP) transistor 51 may be formed on an n-well 120. Gate insulation films 110 and 112 of high voltage transistors 45 may be formed to have a third thickness t3 which is greater, and typically substantially greater, than the second thickness t2.

High voltage transistor 41 may have a heavily doped N+ gate 111, and high voltage transistor 51 may have a heavily doped P+ gate 113.

Memory cell transistors 11, 21 and 31 may be formed at a memory cell region adjacent to peripheral region 200. Each of memory cell transistors 11, 21 and 31 may include a gate insulation film 104 having a fourth thickness t4 which is greater than or equal to the second thickness t2. Each of memory cell transistors 11, 21 and 31 may further include a floating gate 105, a control gate insulation film 106 and a control gate 107.

According to an exemplary embodiment, low voltage transistors may be formed to have different thicknesses of gate oxide films. In particular, a low voltage transistor having a relatively thin gate oxide film may be used to form a page buffer, and a low voltage transistor having a relatively thick gate oxide film may be used to form an input/output circuit. Accordingly, it is possible to obtain high speed operation and low power consumption characteristics.

In an exemplary embodiment, when the first thickness t1 is about 10 to 60 angstroms, the second thickness t2 may be set to be about 60 to 160 angstroms.

Figure 4:
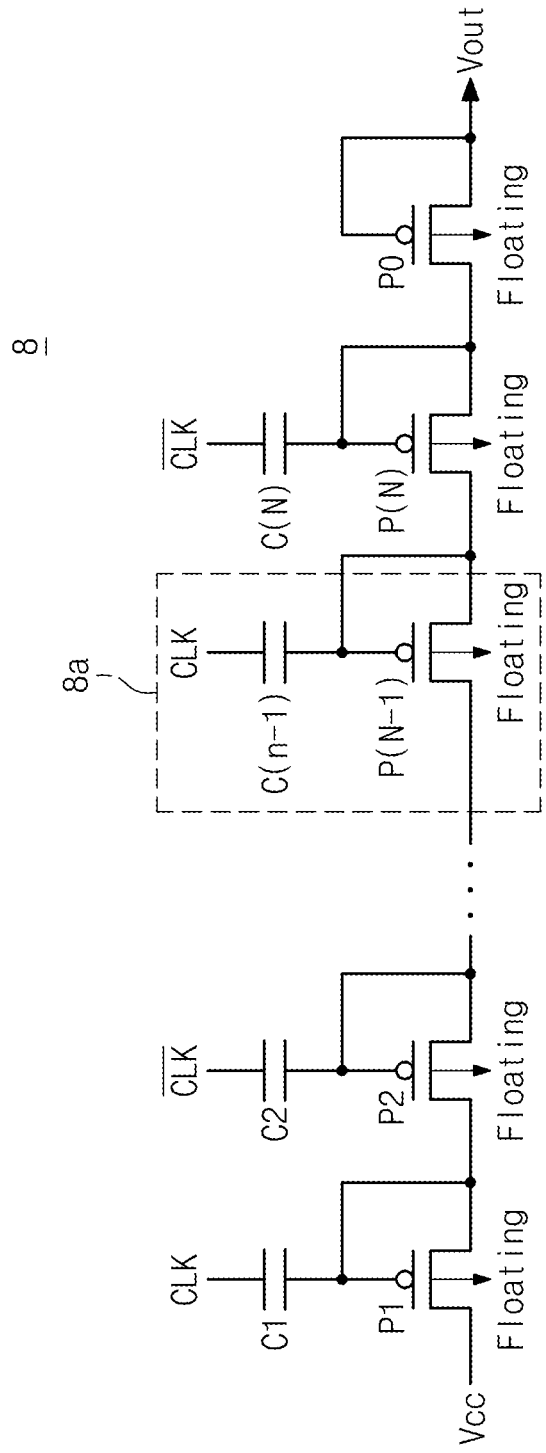
FIG. 4 is a circuit diagram of a high voltage generator in FIG. 2 according to an exemplary embodiment.

FIG. 4 is a circuit diagram of an exemplary embodiment of high voltage generator 8 of in FIG. 2.

Referring to FIG. 4, high voltage generator 8 may be formed of at least two pump units 8a which are cascade connected and each of which is formed of a capacitor and a PMOS transistor. A voltage may be pumped by boosting of a capacitor during the high portions of clock signals CLK and $\overline{\text{CLK}}$. The pumped voltage may be transferred to a next pump unit to generate a high voltage.

PMOS transistors P1, P2, . . . , P(N) within the pump units each may be formed of a low voltage transistor of core circuit 220 (refer to FIG. 1), respectively. That is, a gate insulation film of the PMOS transistor P1 may be formed to have the same thickness as that of low voltage transistor 81 shown in FIG. 4.

As a result, the thickness of a gate insulation film of the PMOS transistor P1 may be greater than that of each of low voltage transistors 71 and 91 within input/output circuit 240 and the same as that of a gate insulation film within core circuit 220.

The thickness of a gate insulation film of the PMOS transistor P1 will be more fully described with reference to FIG. 5.

FIG. 5 is a cross-sectional view of MOS transistors forming pump unit 8a in FIG. 4.

Referring to FIG. 5, a PMOS transistor M2 may be formed on an n-well 125 of substrate 150 and may include a gate electrode 58, source and drain regions 46 and 48, and a gate insulation film 56 having the thickness t2. The PMOS transistor M2 may correspond to one of PMOS transistors P1, P2, . . . , P(N) in FIG. 4.

A MOS transistor M1 may be formed on substrate 150 and may include a gate electrode 54, source and drain regions 42 and 44, and a gate insulation film 52 having the third thickness t3 which is greater than the second thickness t2. The MOS transistor M1 may function as a MOS capacitor and correspond to one of capacitors C1, C2, . . . , C(n−1), C(N) in FIG. 4. The MOS transistor M1 may be formed to have the same size as high voltage transistors 45 in FIG. 3.

In an exemplary embodiment of the inventive concept, an input/output circuit may be formed of the first low voltage transistor including a gate insulation film having the first thickness. A low voltage transistor of a high voltage pump circuit may be formed of the second low voltage transistor including a gate insulation film having the second thickness which is greater than the first thickness. Accordingly, high speed operation and low power consumption characteristics of a non-volatile semiconductor memory device may be improved.

Figure 6:
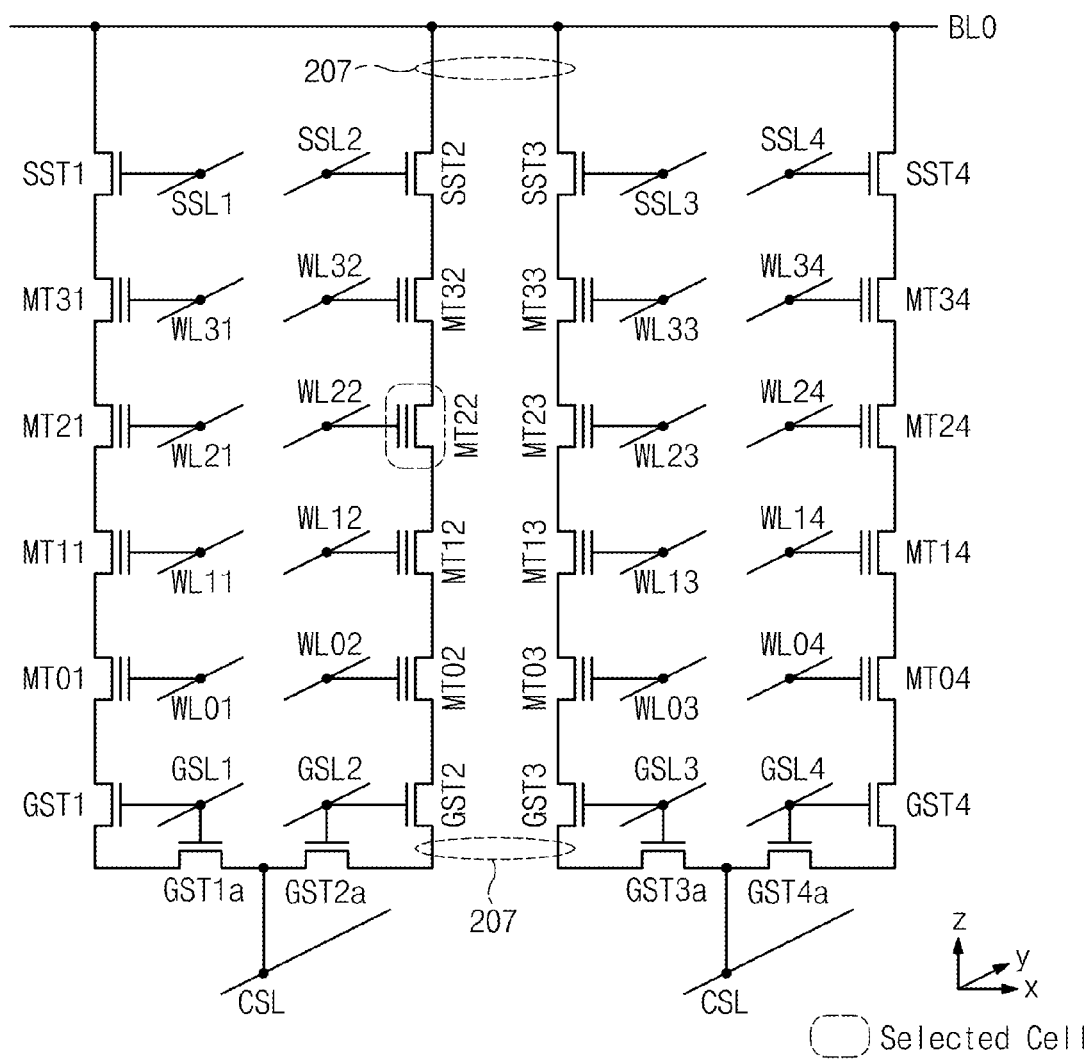
FIG. 6 is a circuit diagram of a memory cell array in FIG. 2 according to an exemplary embodiment.

FIG. 6 is a circuit diagram of a memory cell array in FIG. 2 according to another exemplary embodiment. If a flash memory device is formed to have a three-dimensional structure, a memory cell array may include memory cells arranged in a three-dimensional structure illustrated in FIGS. 7 to 10 and described in detail below. But, for ease of illustration, some memory cells arranged on an XZ plane may be illustrated in FIG. 6. Although not shown in FIG. 6, memory cells may provided on a plurality of XZ planes which are arranged or stacked in a Y-axis direction.

Referring to FIG. 6, a plurality of cell strings in a memory cell array may be connected between a bit line BL0 and a common source line CSL. Each of the cell strings may include a plurality of transistors connected in series. For example, as a unit string, a cell string may include at least one string selection transistor SST1, at least one ground selection transistor pair GST1 and GST1a, and a plurality of memory transistors MT01 to MT31 connected in series between the selection transistors SST1 and GST1.

The string selection transistors SST1 to SST4 (SST) may be MOS field effect transistors using string selection lines SSL1 to SSL4 (SSL) crossing the bit line BL0 as their gate electrodes. The ground selection transistors GST1 to GST4 and GST1a to GST4a (GSL) may be MOS field effect transistors using ground selection lines GSL1 to GSL4 as their gate electrodes.

The memory transistors MT01 to MT34 (MT) may be MOS field effect transistors using a plurality of word lines WL01 to WL34 arranged between the string selection lines SSL and the ground selection lines GSL and crossing the bit line BL0.

The string selection line SSL, the ground selection line GSL, and the word lines WL in FIG. 6 may be formed by stacked conductive patterns 260 as illustrated in FIGS. 7 to 10.

Figure 7:
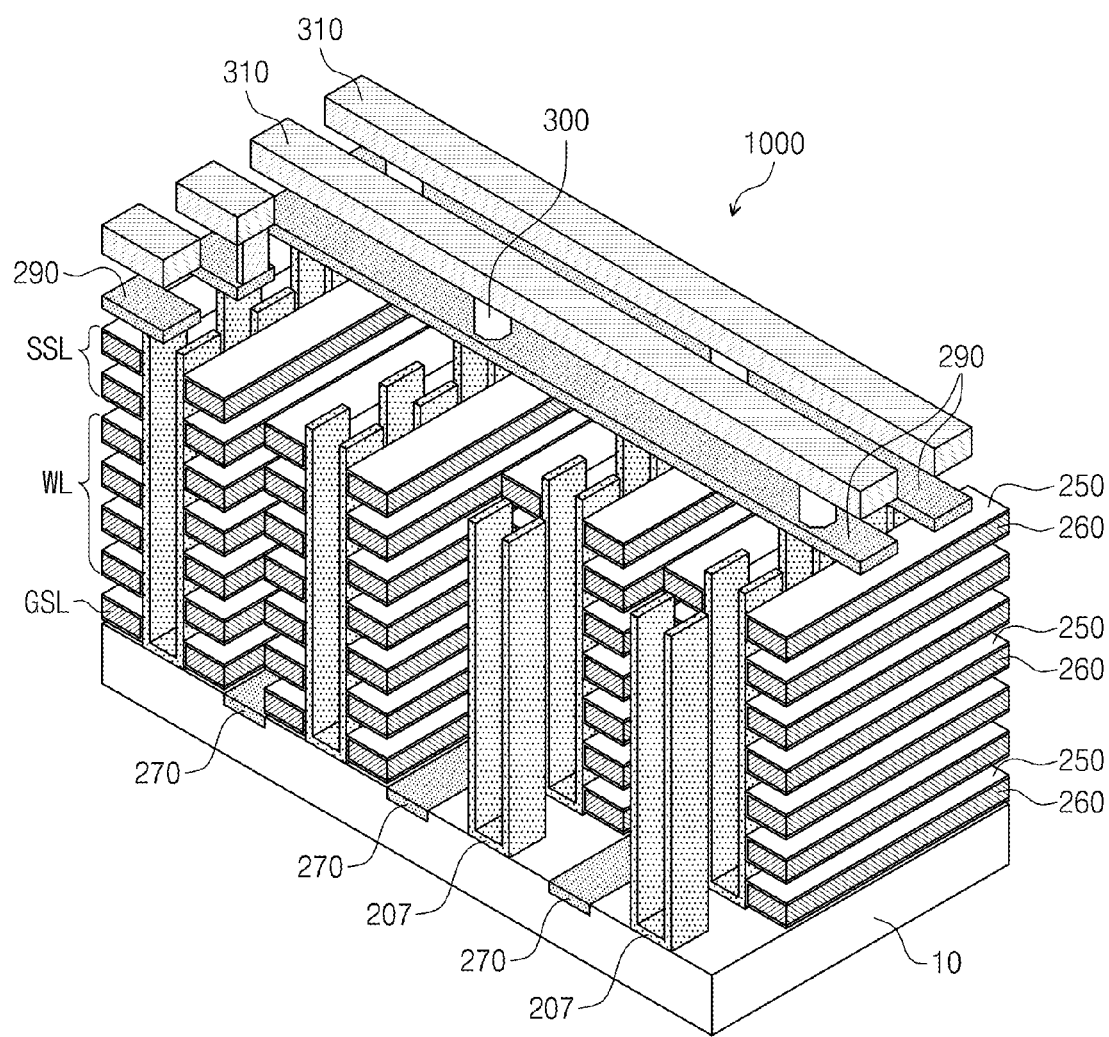
FIG. 7 is a cross-sectional view of a memory cell array illustrated in FIG. 6 according to an exemplary embodiment.

Gate insulation films of the memory transistors MT may be formed by an information storing element 250 illustrated in FIG. 7, respectively. Gate insulation films of the string and ground selection transistors SST and GST may be formed by information storing element 250, respectively.

Herein, information storing element 250 and a conductive pattern 260 may be formed within respective recess regions. Information storing element 250 may be formed using a deposition process (e.g., a chemical vapor deposition (CVD) or atomic layer deposition (ALD) process) which provides good step coverage. Information storing element 250 can include a charge storing film. For example, information storing element 250 may include a trap insulation film, a floating gate electrode, or an insulation film including conductive nano dots. Information storing element 250 may further include a tunnel oxide film and a blocking insulation film. The tunnel insulation film may include one of a silicon oxide film or a silicon nitride film, and the block insulation film may include one of an aluminum oxide film, a silicon oxide film, or a silicon nitride film.

Figure 8:
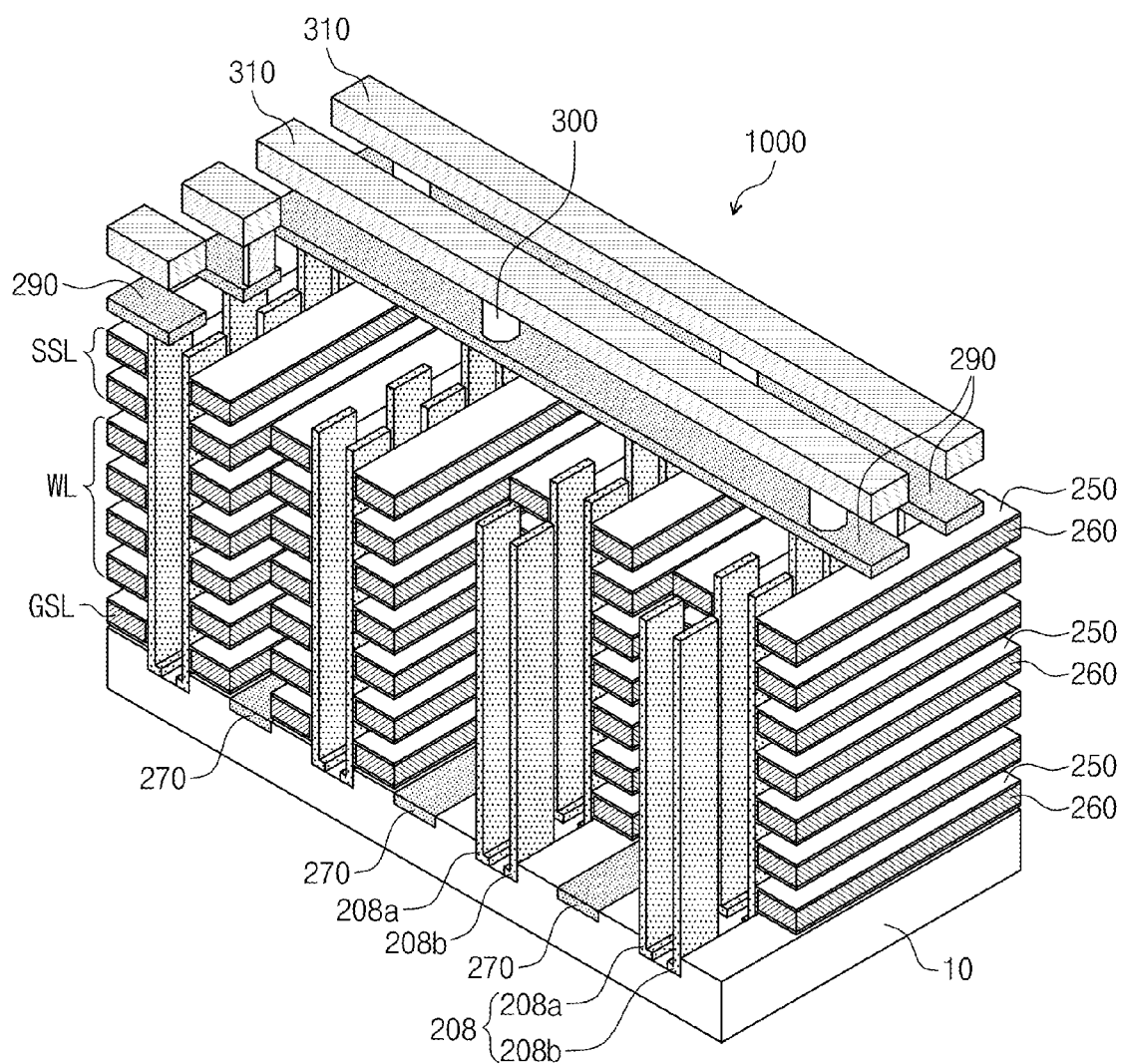
FIG. 8 is a cross-sectional view of a memory cell array according to a modified embodiment.

The memory transistors MT, the string selection transistors SST, and the ground selection transistors GST in FIG. 6 may use active patterns 207 or 208 in FIGS. 7 to 10 as their active regions or channel regions. The memory transistors MT may be formed at intersections of active patterns 207 or 208 and the word lines WL. Meanwhile, each of active patterns 207 and 208 may include portions isolated electrically or spatially. In particular, active patterns 207 may have two extension portions spatially separated from each other as illustrated in FIG. 7 or include first active pattern 208a and second active pattern 208b spatially separated from each other as illustrated in FIG. 8.

Ground selection lines GSL formed of conductive patterns 260 may be used as a common gate electrode of two serially-connected transistors GST1 and GST1a, respectively. One of the two serially-connected transistors GST1 and GST1a may be a vertical transistor using active pattern 207 or 208 as a channel, and the other thereof may be a horizontal transistor using an upper surface of a substrate 10 as a channel.

Threshold voltages of the vertical transistors GST1 to GST4 may be different from those of the horizontal transistors GST1a to GST4a. A threshold voltage difference may be accomplished by at least one of a difference between impurity concentrations of active pattern 207 or 208 and substrate 10 or a difference between crystallization structures thereof.

In another embodiment, a threshold voltage difference may be accomplished by a difference between a distance from active pattern 207 or 208 to substrate 10 and a distance from active pattern 207 or 208 to the ground selection line GSL and a difference between dielectric constants of interposed dielectric films.

A difference between threshold voltages of the vertical and horizontal transistors may be used to control electrical connecting to active pattern 207 or 208 more effectively or to make selective connection with one of two portions of active pattern 207 or 208.

Program, erase and read operations of a three-dimensional flash memory device will be described below with reference to the memory cell array structure in FIG. 6.

In FIG. 6, a selected cell MT22, for example, may be programmed by a potential difference between a program voltage Vpgm and a ground voltage GND applied to a selected word line WL22 and a selected bit line BL0. A first pass voltage and a second pass voltage may be applied to a string selection line SSL2 and other word lines WL02, WL12 and WL32 of a cell string (hereinafter, referred to as a selected string) including the selected word line WL22, such that the ground voltage GND is transferred to a partial region of active pattern 207 in FIG. 7 adjacent to the selected word line WL22 from the selected bit line BL0. The first pass voltage may be greater than a threshold voltage of the string selection transistor SST2 and less than the program voltage Vpgm. For example, the first pass voltage may be a power supply voltage VCC. The second pass voltage may be a voltage Vpass which is greater than a threshold voltage of a programmed memory transistor and less than the program voltage Vpgm.

Meanwhile, the ground selection lines GSL1 to GSL4 may be supplied with a voltage (e.g., a ground voltage) sufficient to turn off the ground selection transistors GST1 to GST4. Further, a ground voltage GND may be applied to the string selection lines SSL1, SSL3 and SSL4 of cell strings (hereinafter, referred to as program-inhibited strings) which don't include the selected word line WL22. In this case, the program-inhibited strings may be electrically isolated from the selected bit line BL0. That is, they may be floated.

With the above-described operation, the selected word line WL22 may have a potential identical to a gate electrode of a memory transistor in the program-inhibited string. Below, this gate electrode may be called a conjugated word line. The program voltage Vpgm may be applied to the selected word line WL22 and at least one conjugated word line WL24. Further, the program voltage Vpgm may be applied to a conjugated word line WL23 adjacent to the selected word line WL22.

Nevertheless, as described above, since the program-inhibited strings are floated, they may have a potential boosted by the program voltage Vpgm and the second pass voltage Vpass. Memory transistors of the conjugated word line may be program inhibited by boosting of the program-inhibited strings.

Meanwhile, a self-boosting technique for a two-dimensional NAND flash memory device may be applied to prevent the program-inhibited strings from being programmed. Unselected bit lines BL1 to BLn may be supplied with a voltage (e.g., VCC) which is greater than ground voltage. Before the selected cell is programmed, a pre-charge operation may be carried out to increase potentials of the program-inhibited strings to a predetermined level (e.g., a potential boosted by the self-boosting technique).

Since a pair of electrode groups adjacent to one active pattern 207 or 208 is electrically isolated, only one of two spatially separated portions of one active pattern 207 or 208 may be connected with the selected bit line BL0 grounded. Accordingly, adjacent cells sharing one active pattern 207 or 208 may be programmed independently.

Below, an erase operation will be more fully described with reference to accompanying drawings. A plurality of memory cells including the selected cell and included within one block may be erased substantially simultaneously by a difference between an erase voltage Verase applied to substrate 10 (or, bulk) and a ground voltage GND applied to word lines WL. Active patterns 207 may be formed to directly contact with substrate 10. Active patterns 207 may be formed to have the same conductive type as substrate 10. This means that a voltage applied to substrate 10 is directly transferred to active patterns 207.

Below, a read operation will be more fully described with reference to accompanying drawings. The first voltage V1 which is greater than ground voltage may be applied to the selected bit line BL0, and the ground voltage may be applied to the common source line CSL. A read voltage Vread may be applied to ground and string selection lines GSL2 and SSL2 included in the selected string. Herein, the read voltage Vread may be greater than threshold voltages of the ground and string selection transistors GST and SST. For example, the read voltage Vread may be greater than a threshold voltage of a programmed memory transistor and less than the program voltage Vpgm.

According to this bias condition, the first voltage V1 from the selected bit line BL0 and the ground voltage from the common source line CSL may be applied to both sides of the selected cell. That is, a current (hereinafter, referred to as a read current) (i.e., information stored in the selected cell) flowing through the selected cell may be determined by information (i.e., a charge amount) stored in the selected cell. During this read operation, string selection lines SSL1, SSL3 and SSL4 of unselected strings may be grounded. This means that a read current path is not formed at other strings not passing the selected cell.

Since a pair of electrode groups adjacent to one active pattern 207 or 208 is electrically isolated, only one of two spatially isolated portions in one active pattern may be used as a read current path.

Some of the ground selection lines GSL can be electrically connected to have an equal potential state. For example, the ground selection lines GSL may be formed to have the same connection structure as the word lines WL each placed on the ground selection lines GSL. As a result, the ground selection line GSL2 of the selected string may have a potential state which is the same as one of ground selection lines of program-inhibited strings.

Below, structures in FIGS. 7 to 10 will be described more fully.

FIG. 7 is a cross-sectional view of one example embodiment of a memory cell array illustrated in FIG. 6. In FIG. 7, there is exemplarily illustrated an array structure 1000 of a three-dimensional semiconductor device. Referring to FIG. 7, each of active patterns 207 may include a bottom portion contacting with a top surface of substrate 10 and extension portions extending upward from the bottom portion and being opposite to side walls of conductive patterns 260. The extension portions may be isolated except for a connection via the bottom portion. That is, active patterns 207 may be formed to have a "U" shape, respectively.

Vertically stacked conductive patterns 260 may be used as a string selection line SSL, a ground selection line GSL, and word lines WL in FIG. 6. For example, conductive patterns 260 each placed at the uppermost and lowermost layers may be used as the string selection line SSL and the ground selection line GSL. Conductive patterns 260 between conductive patterns 260 each placed at the uppermost and lowermost layers may be used as word lines, respectively. In FIG. 7, two conductive patterns 260 placed at upper layers may be used as the string selection line SSL.

Conductive patterns 260 used as the string selection line SSL may be separated from each other. Unlike, conductive patterns 260 used as the word lines WL may constitute a plurality of word line groups. Conductive patterns 260 in each word line group may be connected electrically or physically.

FIG. 8 is a cross-sectional view of a memory cell array according to a modified embodiment. The structure shown in FIG. 8 may be substantially identical to that in FIG. 7 except for active pattern shape and arrangement and a manner of forming active pattern.

Referring to FIG. 8, first active pattern 208*a* and second active pattern 208*b* may be formed to be separated spatially from each other. First and second active patterns 208*a* and 208*b* may constitute an active pattern 208 in FIG. 8. Due to an over-etch process, bottom portions of first and second active patterns 208*a* and 208*b* may be formed to be lower than an upper surface of substrate 10. With this structure, a contact area between first and second active patterns 208*a* and 208*b* and substrate 10 may increase.

Figure 9:
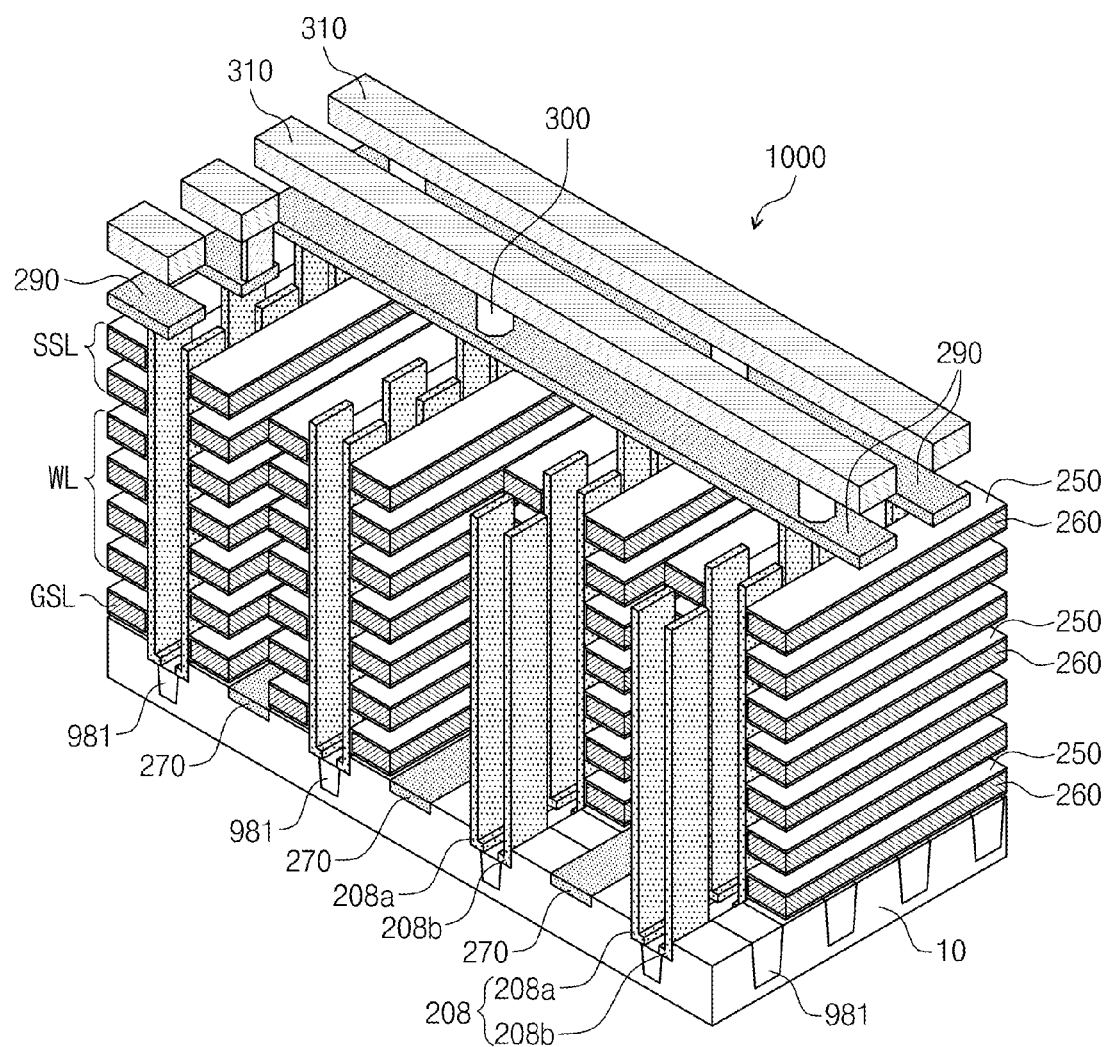
FIG. 9 is a cross-sectional view of a memory cell array according to another modified embodiment

FIG. 9 is a cross-sectional view of a memory cell array according to another modified embodiment.

Referring to FIG. 9, device isolation patterns 981 may be formed under first and second active patterns 208*a* and 208*b*. As illustrated in FIG. 9, first and second active patterns 208*a* and 208*b* may be electrically separated by device isolation patterns 981. Device isolation patterns 981 can horizontally extend into lower portions of conductive patterns 260. Further, device isolation patterns 981 can be formed to cross a trench 230 by additional extension. In this case, an impurity region 270 used as a source region may be formed using a self-aligned source (SAS) technique.

Figure 10:
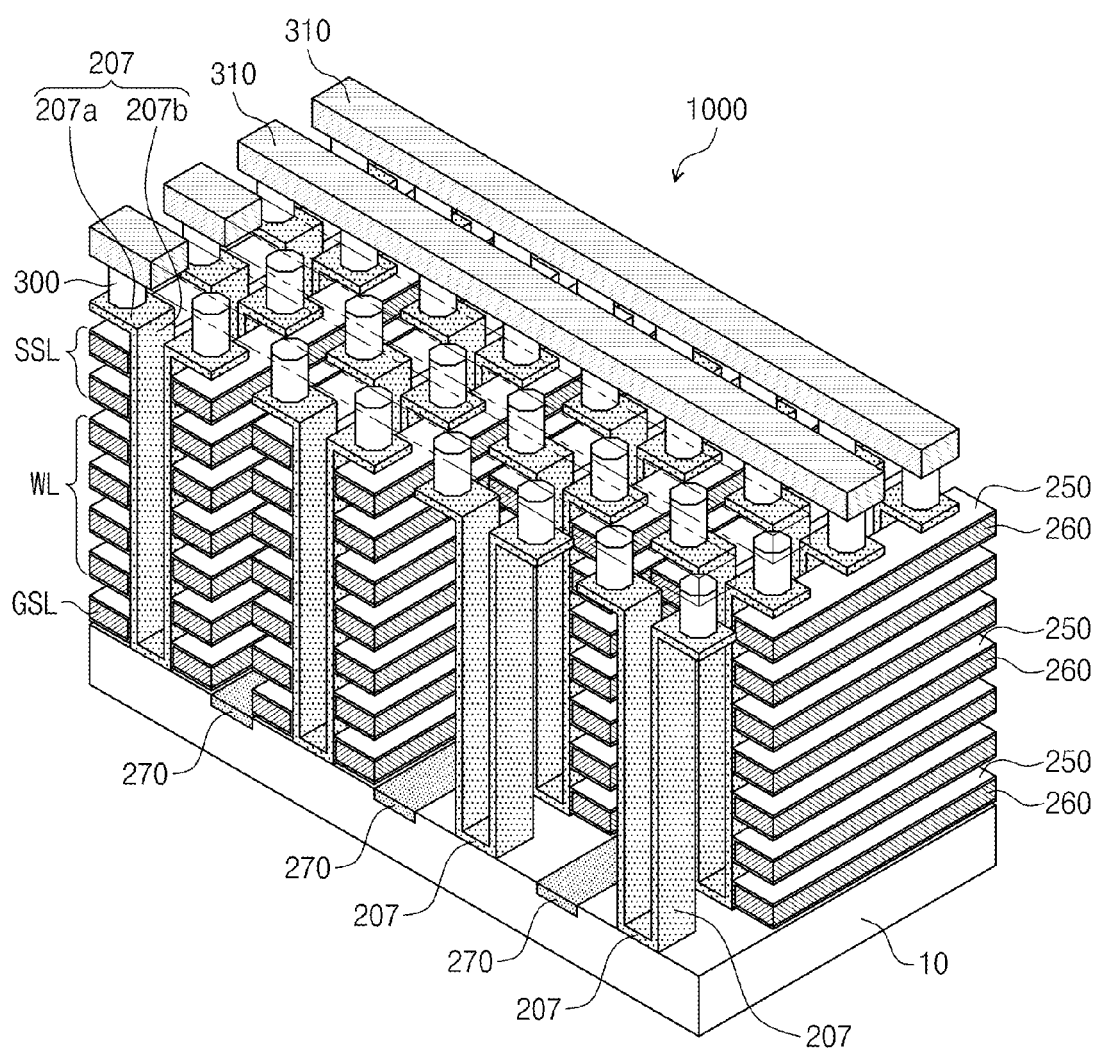
FIG. 10 is a cross-sectional view of a memory cell array according to still another modified embodiment.

FIG. 10 is a cross-sectional view of a memory cell array according to still another modified embodiment. A structure in FIG. 10 may be similar to that in FIG. 7 except for an active pattern shape and a pad pattern 290. Active pattern 207 may have a pad portion 207*a* which is formed by extending it horizontally from an opening portion and into upper portions of conductive patterns 260. Pad portion 207*a* can be formed to have a conductive type different from a main portion 207*b* of active pattern 207 formed within the opening portion. In this case, an upper wire 310 and a plug 300 may be connected directly with pad portion 207*a* of conductive pattern 260 without no pad pattern 290 being interposed therebetween as in the embodiments of FIGS. 7-9.

A flash memory device according to one or more embodiments of the inventive concept may have a three-dimensional memory cell array structure which is illustrated in FIGS. 7 to 10*y*.

Below, various systems adopting a memory device according to one or more embodiments of the inventive concept will be more fully described.

FIGS. 11A to 11D are diagrams for describing various memory bus protocols of a system which may employ a memory according to an one or more embodiments of the inventive concept.

Figure 11A:
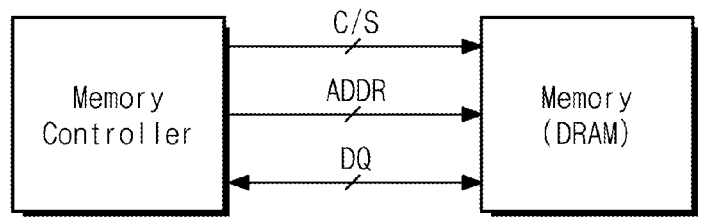
FIGS. 11A to 11D are diagrams for describing various memory bus protocols of a system which may employ a memory according to an one or more embodiments of the inventive concept.

In FIG. 11A, there is exemplarily illustrated a bus protocol between a memory controller and a memory (e.g., DRAM). Control signals C/S and an address signal ADDR may be transferred to the memory controller from the memory. The control signals C/S may include /CS, CKE, /RAS, /CAS, /WE, and the like. Data DQ may be transferred bi-directionally between the memory controller and the memory.

Figure 11B:
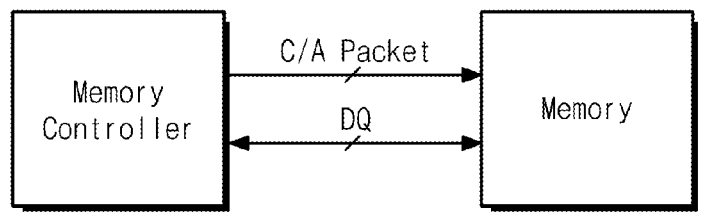

Referring to FIG. 11B, packetized control and address signals C/A Packet may be transferred from the memory controller to the memory. Data DQ may be transferred bi-directionally between the memory controller and the memory.

Figure 11C:
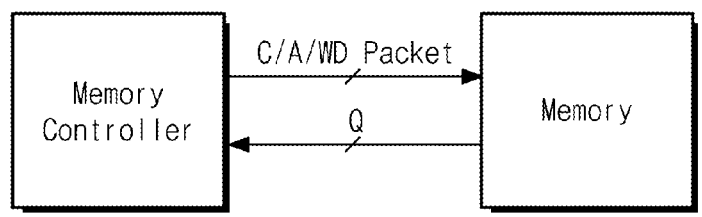

Referring to FIG. 11C, packetized control, address and write signals C/A/WD Packet may be transferred from the memory controller to the memory. Data DQ may be transferred in one direction from the memory controller to the memory.

Figure 11D:
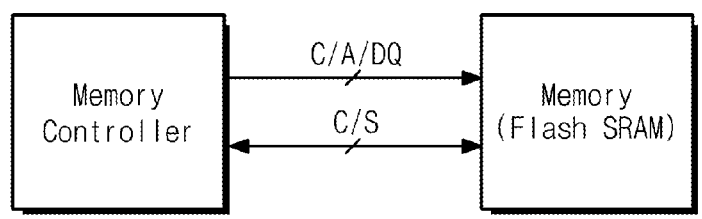

Referring to FIG. 11D, control signals C/S may be sent to the memory (e.g., a flash SRAM) from the memory controller, and a command, an address and data C/A/DQ may be transferred bi-directionally between the memory controller and the memory.

In FIGS. 11A to 11D, it is possible to improve high speed operation and low power consumption characteristics of a memory by adopting low voltage transistors whose gate insulation films have different thicknesses.

Figure 12:
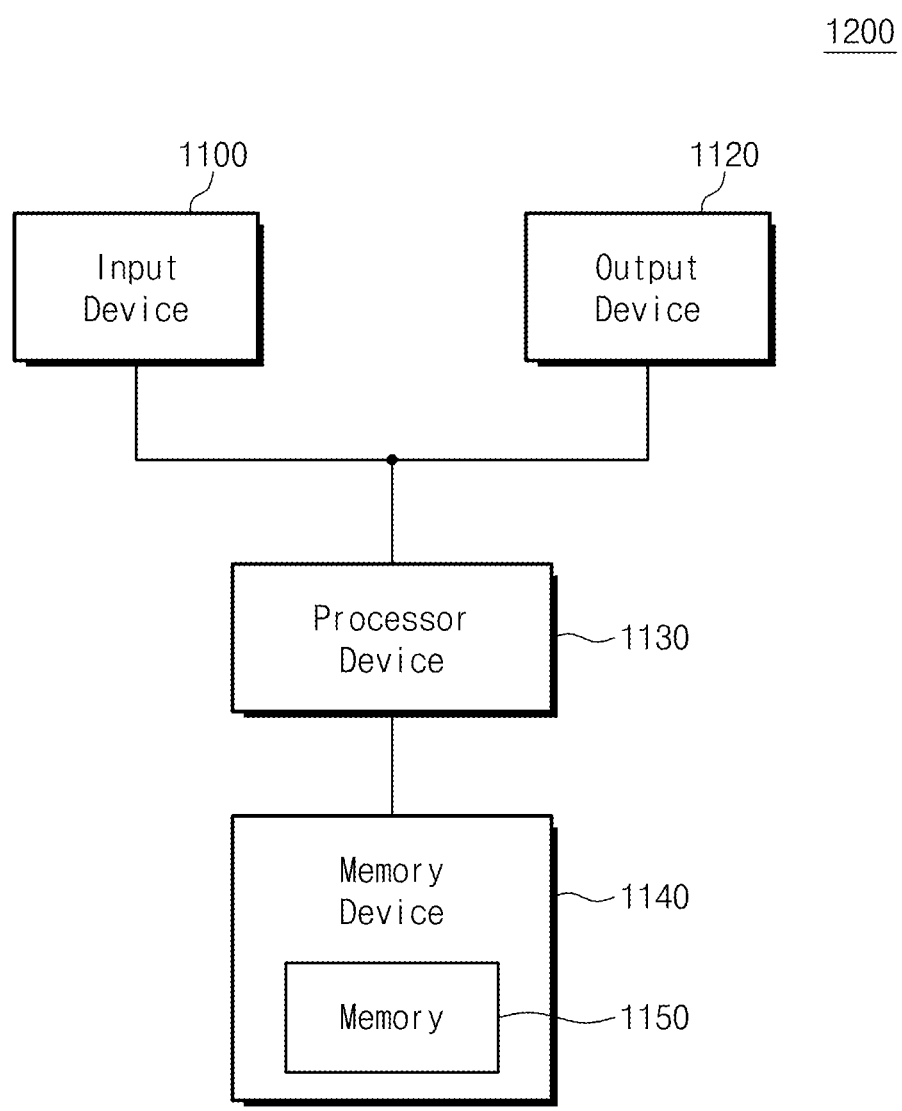
FIG. 12 is a block diagram of an electronic system which may employ a memory according to one or more embodiments of the inventive concept.

FIG. 12 is a block diagram of a system which may employ a memory according to one or more embodiments of the inventive concept. Referring to FIG. 12, a system 1200 may include an input device 1100, an output device 1120, a processor device 1130, and a memory device 1140.

Memory device 1140 may include a typical memory or a memory 1150 having a three-dimensional stack structure. Processor 1130 may control input device 1100, output device 1120 and memory device 1140 via corresponding interfaces, respectively.

In FIG. 12, it is possible to improve high speed operation and low power consumption characteristics of a memory by adopting low voltage transistors whose gate insulation films have different thicknesses, at a peripheral region of the memory.

Figure 13:
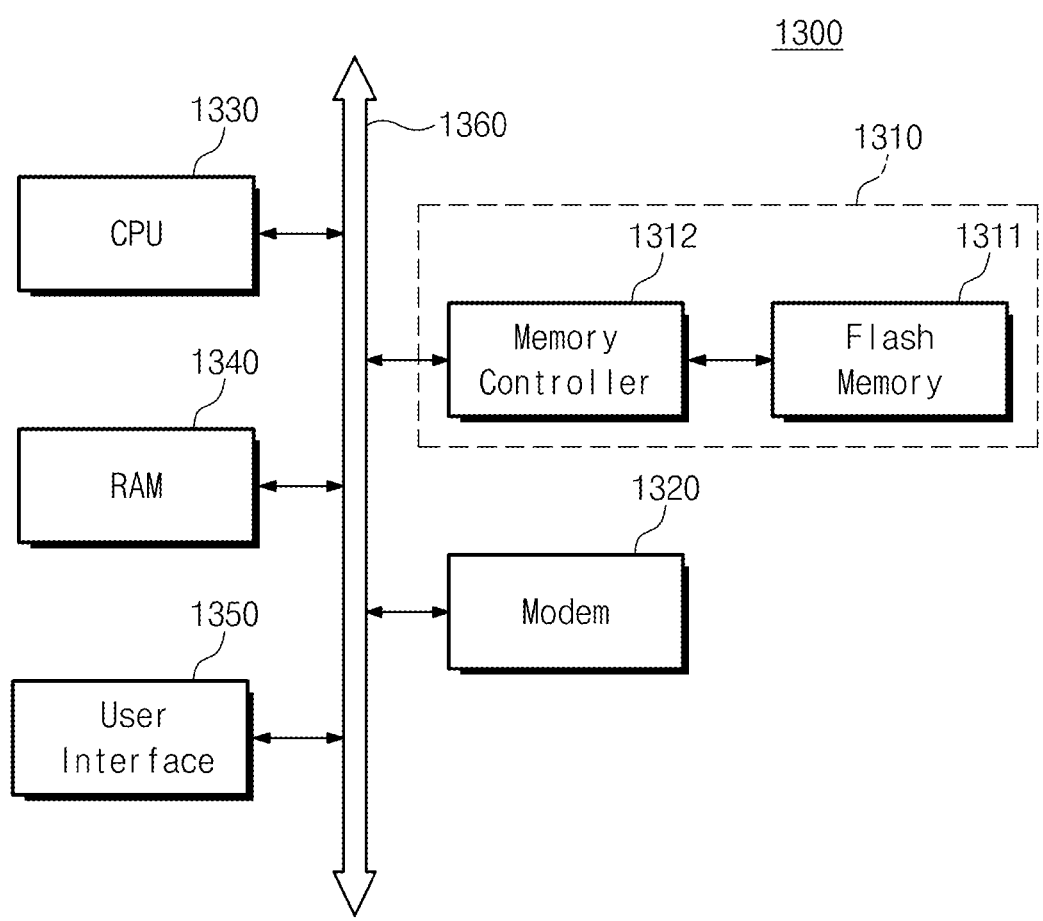
FIG. 13 is a block diagram of an information processing system including a memory according to one or more embodiments of the inventive concept.

FIG. 13 is a block diagram of an information processing system which may employ a memory according to one or more embodiments of the inventive concept.

Referring to FIG. 13, an information processing system 1300 such as a mobile device or a desktop computer may be provided with a flash memory system 1310 according to one or more embodiments of the inventive concept. Information processing system 1300 may further include a modem 1320, a CPU 1330, a RAM 1340, and a user interface 1350 which are connected through a system bus 1360. Flash memory system 1310 may be a flash memory system and may include a memory controller 1312 and a flash memory 1311. Flash memory system 1310 may store data processed or to be processed by CPU 1330. Herein, flash memory system 1310 may be formed of a solid state disk/drive (SSD) device. In this case, information processing system 1300 may stably store mass data in flash memory system 1310. According to an increase in the reliability, flash memory system 1310 may reduce a resource needed for error correction, so that a high-speed data exchange function is provided with information processing system 1300. Although not shown in FIG. 13, information processing system 1300 according to one or more embodiments of the inventive concept may further include an application chipset, a camera image processor (CIS), an input/output device, and the like.

A memory system 1310, for example a flash memory system, may be packaged by various packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 14:
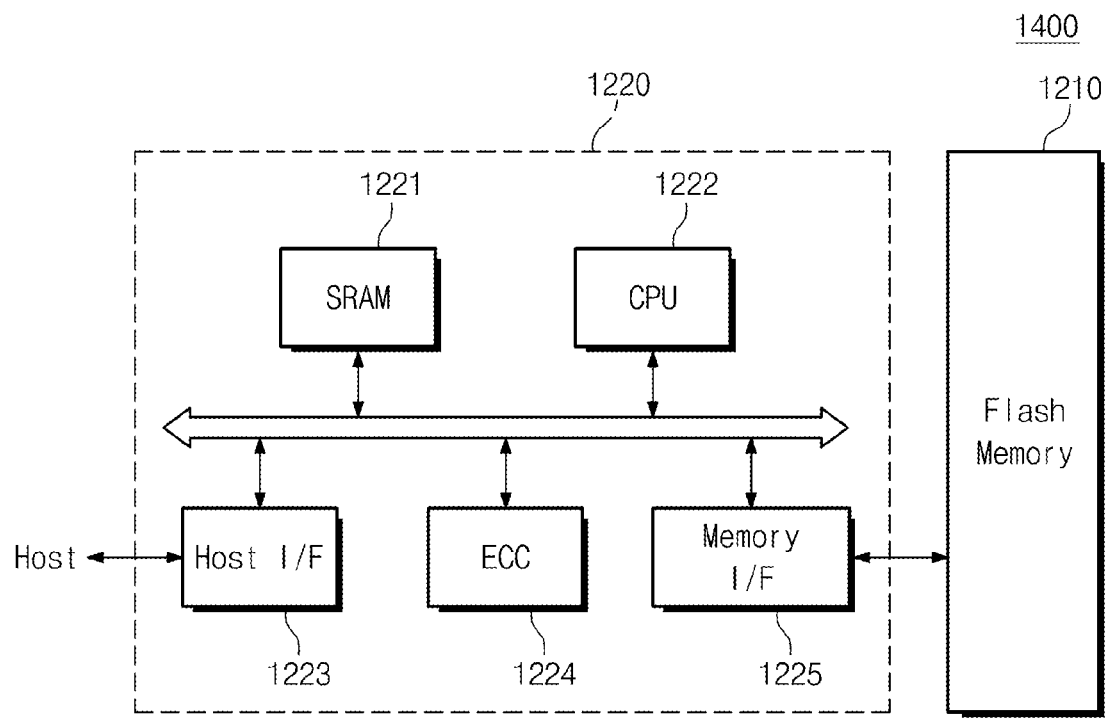
FIG. 14 is a block diagram of a memory card which may employ a memory according to one or more embodiments of the inventive concept.

FIG. 14 is a block diagram of a memory card which may employ a memory according to one or more embodiments of the inventive concept. Referring to FIG. 14, a memory card 1400 may include a flash memory 1210 according to one or more embodiments of the inventive concept to support a mass storage capacity. Memory card 1400 may include a memory controller 1220 which is configured to control a data exchange operation between a host device (not shown) and flash memory 1210.

An SRAM 1221 may be used as a working memory of a CPU 1222. A host interface 1223 may provide a data exchange interface between memory card 1200 and the host.

An ECC block 1224 may be configured to detect and correct errors in data read out from flash memory 1210. Memory interface 1225 may perform a data interface function between CPU 1222 and flash memory 1210. CPU 1222 may control a data exchange operation of memory controller 1220 overall. Although not shown in FIG. 14, memory card 1400 may further include a ROM storing code data for interface with a host device.

In memory card 1400, it may be possible to improve high speed operation and low power consumption characteristics of a memory by adopting low voltage transistors whose gate insulation films have different thicknesses, at a peripheral region of the memory.

In accordance with exemplary embodiments of the inventive concept, since low voltage transistors used at an input/output circuit are formed to be different from low voltage transistors used at a core circuit or a high voltage pump circuit, high speed operation and low power consumption characteristics of a non-volatile memory device may be improved or maximized.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description. A method of fabricating low voltage transistors or circuit blocks of a non-volatile semiconductor memory device may be changed or modified variously.

What is claimed is:

1. A device, comprising:
    a memory cell region including a memory cell array having at least one memory cell; and
    a peripheral region, wherein the peripheral region includes:
        a first transistor which belongs to an input/output circuit for the at least one memory cell, the first transistor having a gate insulation film with a first thickness; and
        a second transistor which belongs to a core circuit including a page buffer for the memory cell array, the second transistor having a gate insulation film with a second thickness which is greater than the first thickness.

2. The device of claim 1, wherein an operating voltage of the first transistor is less than an operating voltage of the second transistor.

3. The device of claim 1, wherein one of the first and second transistors is one of a PMOS transistor having a P+ gate, and an NMOS transistor having an N+ gate.

4. The device of claim 1, further comprising:
    third transistors disposed at the peripheral region and including corresponding gate insulation films each having a third thickness that is different from the first thickness and the second thickness; and
    memory cell transistors disposed at the memory cell region and including corresponding gate insulation films each having a fourth thickness that is different from the third thickness.

5. The device of claim 4, wherein the third thickness is greater than the second thickness and the fourth thickness is at least as great as the second thickness.

6. The device of claim 4, wherein each of the memory cell transistors includes a floating gate and a control gate, the control gate being P+ doped.

7. The device of claim 4, wherein the memory cell transistors are VNAND memory cells arranged in a three-dimensional stack structure and have a control gate formed of metal, respectively.

8. The device of claim 4, wherein the memory cell transistors are NAND flash memory cells.

9. A device comprising:
a memory cell region; and
a peripheral region, wherein the peripheral region comprises:
an input/output circuit including a first transistor having a gate insulation film with a first thickness; and
a core circuit including a second transistor having a gate insulation film with a second thickness greater than the first thickness.

10. The device of claim 9, wherein a threshold voltage of the first transistor is less than that of the second transistor.

11. The device of claim 10, wherein an operating voltage of the input/output circuit is less than an operating voltage of the core circuit.

12. The device of claim 11, wherein one of the first and second transistors is one of a PMOS transistor having a P+ gate and an NMOS transistor having an N+ gate.

13. The device of claim 11, further comprising third transistors disposed at the peripheral region and having corresponding gate insulation films each having a third thickness that is greater than the second thickness.

14. The device of claim 11, further comprising memory cell transistors disposed at the memory cell region and including corresponding gate insulation films each having a fourth thickness that is at least as great as the second thickness.

15. A device, comprising:
a substrate having a memory cell region and a peripheral region;
a nonvolatile memory cell array disposed at the memory cell region and having a plurality of nonvolatile memory cells;
an input/output circuit disposed at the peripheral region and configured to communicate data with the memory cell array, the input/output circuit including a plurality of first transistors each having a gate insulation film having a first thickness; and
a page buffer for the memory cell array disposed at the peripheral region, wherein the page buffer includes a plurality of second transistors each having a gate insulation film having a second thickness that is substantially greater than the first thickness.

16. The device of claim 15, wherein the second thickness is at least twice the first thickness.

17. The device of claim 15, further comprising a voltage generator, disposed in the peripheral area and configured to supply a voltage to the page buffer, wherein the voltage generator includes a plurality of third transistors each connected to operate as capacitors and each having a gate insulation film having a third thickness that is substantially greater than the second thickness.

18. The device of claim 17, wherein the nonvolatile memory cell array includes a plurality of memory cell transistors each having a gate insulation film having a fourth thickness that is different from the third thickness.

19. The device of claim 15, wherein the second transistors have a threshold voltage that is greater than a threshold voltage of the first transistors.

* * * * *